United States Patent [19]

Matzuk

[11] Patent Number: 4,676,105
[45] Date of Patent: Jun. 30, 1987

[54] TISSUE SIGNATURE TRACKING TRANSCEIVER

[75] Inventor: Terrance Matzuk, Verona, Pa.

[73] Assignee: Dymax Corporation, Pittsburgh, Pa.

[21] Appl. No.: 850,269

[22] Filed: Apr. 10, 1986

Related U.S. Application Data

[62] Division of Ser. No. 616,581, Jun. 7, 1987, Pat. No. 4,584,880.

[51] Int. Cl.[4] .............................................. G01N 29/04
[52] U.S. Cl. ......................................... 73/602; 73/662; 73/900; 128/660
[58] Field of Search ................. 73/602, 609, 611, 612, 73/662, 900; 128/660

[56] References Cited

U.S. PATENT DOCUMENTS

| 4,016,750 | 4/1977 | Green | 73/602 |
| 4,140,107 | 2/1979 | Lancee et al. | 73/900 |
| 4,158,308 | 6/1979 | Sharpe et al. | 73/609 |
| 4,170,144 | 10/1979 | Scott | 73/609 |
| 4,470,306 | 9/1984 | Opara | 73/602 |

OTHER PUBLICATIONS

*Program & Abstracts*, Ninth International Symposium on Ultrasonic Imaging and Tissue Characterization, Jun. 3-6, 1984, Wash., D.C., Academic Press, Inc.

*Primary Examiner*—Anthony V. Ciarlante
*Attorney, Agent, or Firm*—Weingarten, Schurgin, Gagnebin & Hayes

[57] ABSTRACT

An ultrasound transceiver providing enhanced imaging by selective filtering of the received signal to provide a variable frequency, constant bandwidth filtering of the received echo signals. The resulting signals are then detected to produce a signal, which when displayed, has a reduced number of false multiple images and enhanced signal quality from the deeper tissue discontinuities. Additionally, the received signal is detected in quadrature by reference to a simulated carrier pilot tone having a nonconstant frequency relationship to the transmitted signal. The resulting signal is post-processed to provide information which is used to display structural features, and in addition, the velocity profile of blood flow. The structure and velocity image information is superimposed to provide a composite signal wherein the static and dynamic characteristic of a patient is completely reported to the observer.

3 Claims, 31 Drawing Figures

FIG. 9
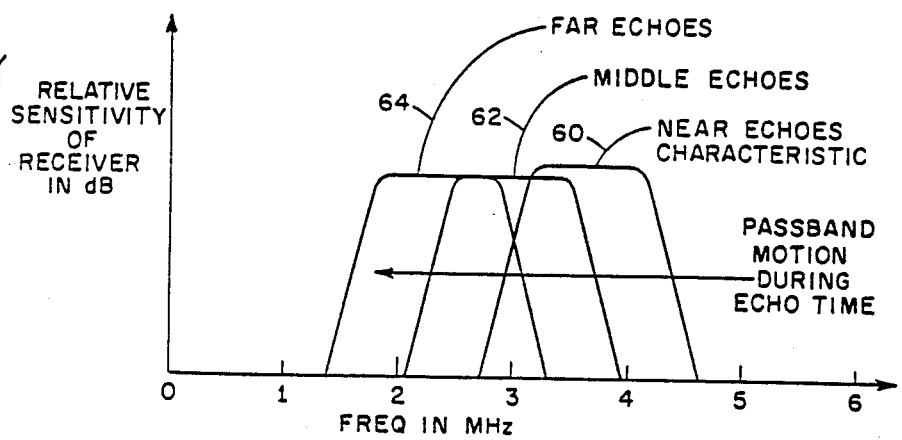
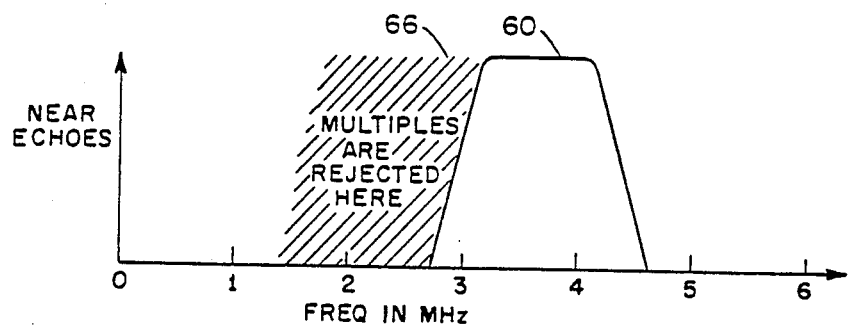
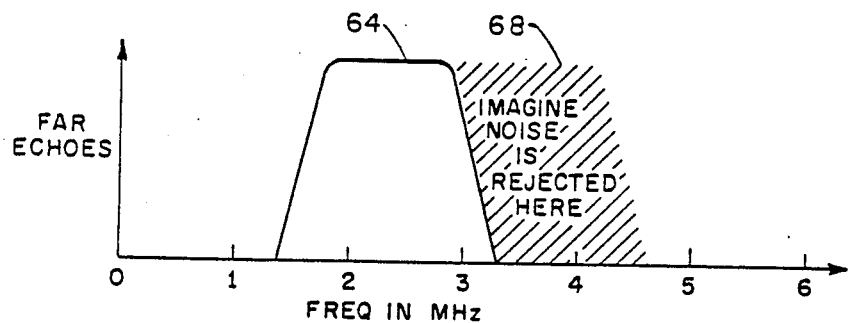

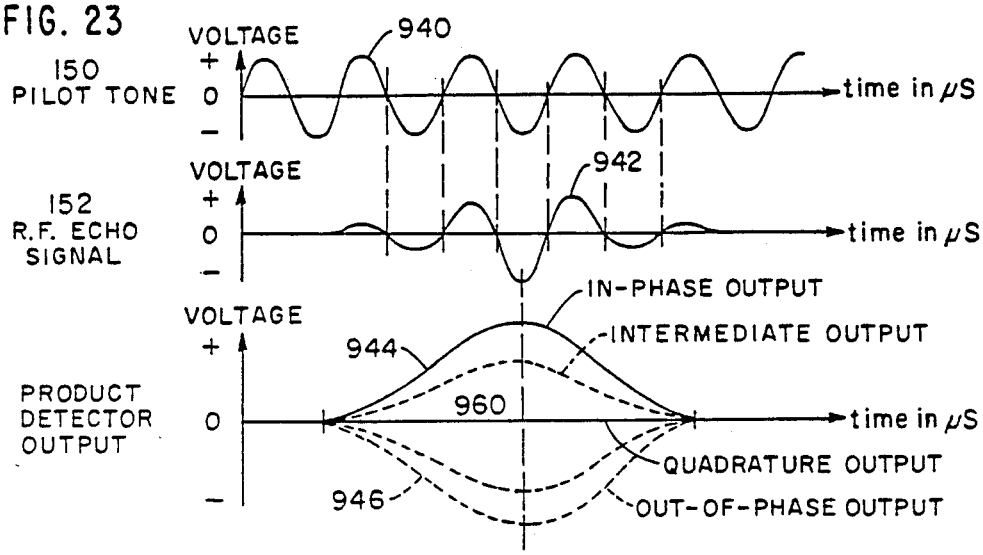
FIG. 23
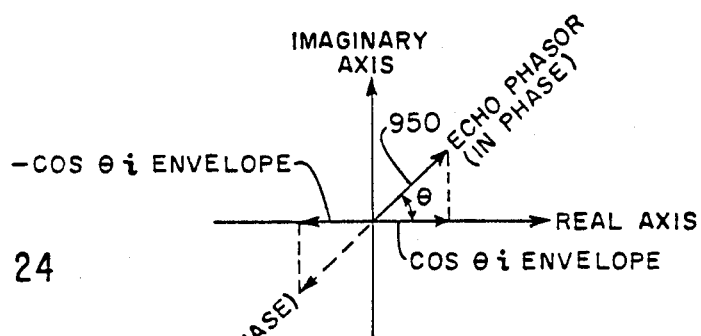
FIG. 24
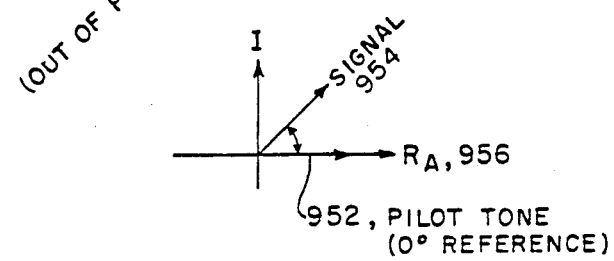
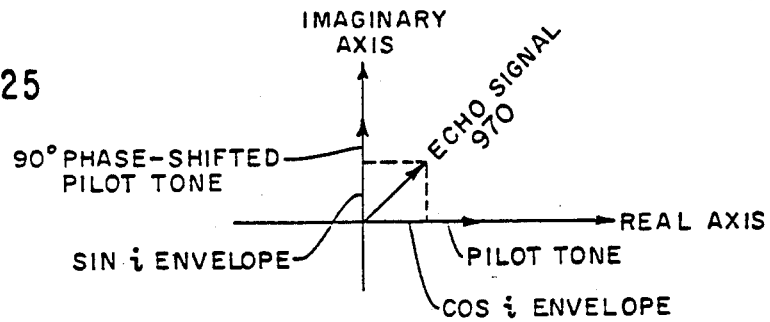
FIG. 25

TISSUE SIGNATURE TRACKING TRANSCEIVER

This is a division of Application Ser. No. 616,581, filed on June 4, 1984 now U.S. Pat. No. 4,584,880.

FIELD OF THE INVENTION

The present invention relates to medical ultrasound systems, and in particular to ultrasound methods and apparatus for processing signals to provide position and velocity information in real-time.

BACKGROUND OF THE INVENTION

For years, clinical ultrasound systems measurement has incorporated either pulsed or continuous wave (CW) ultrasound techniques for imaging of tissue structure and flow of blood therethrough. Since the tissue investigated is a dispersive medium, the signal transmitted into and thereafter reflected from tissue discontinuities suffers significant attenuation. That is, the greater the path taken by the acoustic signal within the subject, the greater the signal is attenuated and otherwise changed. Previous systems have included compensation techniques such as time-controlled gain to provide correction for the anticipated attenuation by the signal in the subject tissue. Similarly, other correction techniques have been applied with varying degrees of success.

Regardless of the correction techniques used thus far, certain problems remain. Typical of these problems are the multiple reflections incurred between the specimen surface to be investigated and the surface and the transducer within the ultrasonic probe. Moreover, for the deeper signal penetration levels, the signal becomes uncorrectably attenuated and unfocussed, often obscuring critical imaging information.

These problems remain, since existing Doppler systems typically assume a signal propagation model incomplete for all applications. As a result, the resolution and/or range of Doppler or pulse-Doppler systems ae unnecessarily limited.

SUMMARY OF THE INVENTION

The ultrasound transceiver of the present invention provides a variable-frequency, fixed-bandwidth reception of the signals reflected from tissue interfaces within the subject, providing improved rejection of multiple surface reflections, combined with improved signal resolution at the extreme penetration depth.

The present invention further provides quadrature signal detection, which includes the recovery of phase information to provide a useful signal over a dynamic range of signals greater than previously known. In particular, useful information is provided even when the ultrasound signal drops well into the noise level of the receiver. Moreover, the signals are sufficiently descriptive of the tissue structure to provide extreme position detail thereof. The newly added position detail information is used to determine the velocity profile of the blood flow. The system according to the present invention simultaneously provides the tissue structure and provides blood flow velocity signals, which when combined, provide an image having a composite of static and dynamic tissue conditions.

Moreover, the present invention describes an ultrasound transceiver having a detected signal, which inherently deconvolves the interaction of the transmitted pulse signal from the tissue reflection response, providing an enhanced signal resolution.

A further feature of the present invention is a combination of ultrasound transceiver and transducer, wherein the ultrasound transducer, although apparently mistuned relative to the transmitted frequency, reduces the dependence on external circuitry for the time-controlled gain signal correction function.

BRIEF DESCRIPTION OF THE DRAWING

These and other features of the present invention can be better understood by reading the following detailed description, taken together with the drawing, wherein:

FIG. 9 is a sequence of frequency curves demonstrating the variable bandpass concept according to the present invention;

FIG. 23 is a group of time-related signal waveforms showing the product detector output of a second embodiment of the present invention;

FIG. 24 is a phasor representation of the product detector output signals of a second embodiment of the present invention;

FIG. 25 is a phasor representation illustrating sine and cosine signal components of a second embodiment according to the present invention;

DETAILED DESCRIPTION OF THE INVENTION

Many commercially available real-time scanners employ linear, trapezoidal, or sector scanning formats, wherein the vertical direction is proportional to echo time elapsed after the outgoing pulse, and proportional to depth in the patient (constant velocity-of-sound approximation, currently a popular concept). Typical embodiments of various known ultrasound systems are shown in several publications such as *Doppler Ultrasound and Its Clinical Measurement*, by Peter Atkinson and John P. Woodcock, Academic Press, New York, 1982, incorporated by reference. Depending upon the style of the probe, any one of these three formats can be scanned within the patient and displayed electronically.

Figure 1:
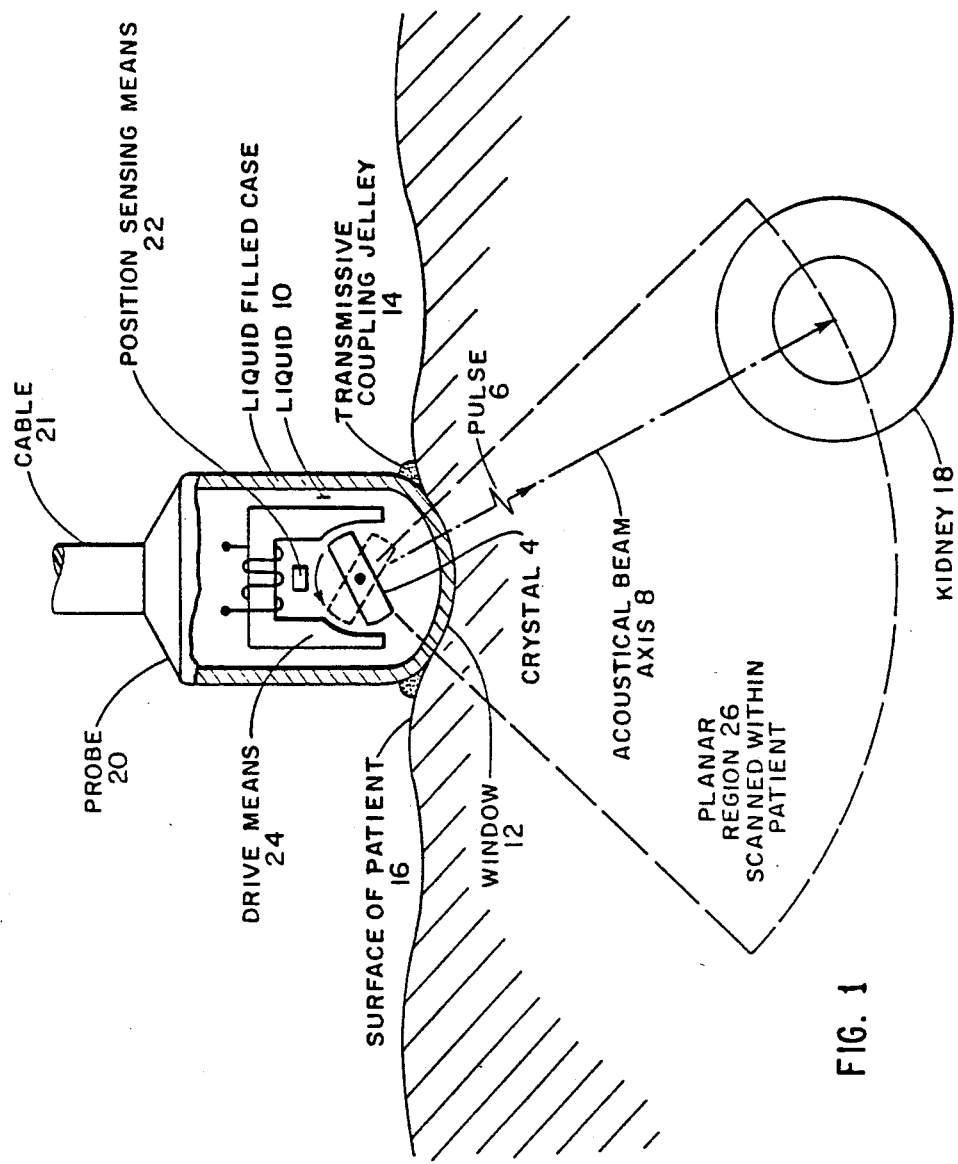
FIG. 1 is a pictorial representation of a typical ultrasound probe.

A typical probe 20 suited for real-time diagnostic medical ultrasound imaging is shown in FIG. 1. A crystal 4 emits an acoustical pulse 6 along axis 8. This pulse first travels through an acoustically transmissive liquid 10 and then through an acoustically transparent window 12. The pulse then passes through an acoustically transmissive coupling jelly 14 and proceeds into the patient 16. Echoes from anatomy of interest, such as kidney 18 return along axis 8 through interfaces 16, 12, 10 back to crystal 4. The crystal 4, acting also as a microphone, generates feeble radio-frequency (RF) information containing amplitude, phase, and temporal information contributing to a single line of imaging information. Drive means 24 cause the beam 8 to scan within region 26 at a rate sufficient to follow respiratory and cardiac-related pulsatile motion (e.g. 20 frames per second), but within the limitation that the distance between adjacent lines is less than the azimuthal resolution of the crystal.

Figure 2:
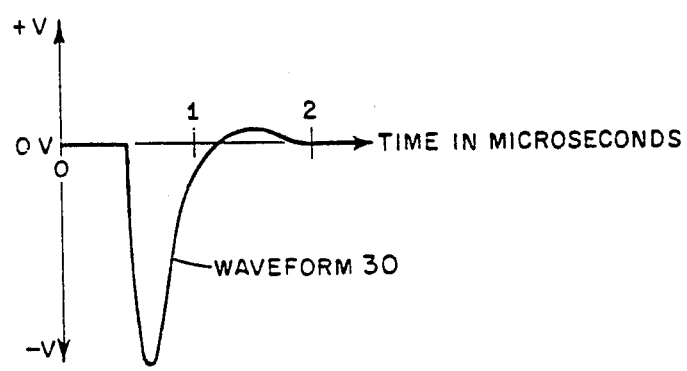
FIG. 2 is a waveform showing a typical excitation signal for the transducer crystal.

A commercially expedient method of exciting the crystal 4, to produce an outgoing acoustical pulse, is to provide the crystal 4 with an "avalanche breakdown" voltage waveform, FIG. 2. When applied to a crystal 4, the waveform 30 causes the acoustically emitted pulse to have a shape shown in FIG. 3 due to bandpass limitations of a commercial crystal of sufficient electromechanical efficiency, FIG. 3.

Figure 3:
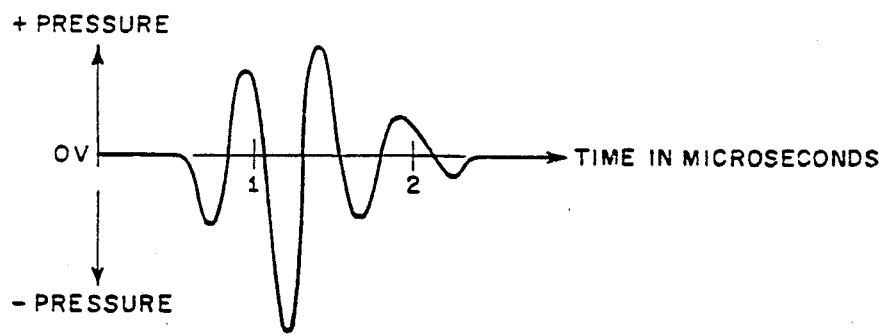
FIG. 3 is a curve showing the frequency spectrum associated with the signal of FIG. 2.

The frequency spectrum associated with the pressure waveform of FIG. 3 is fairly broad.

Figure 4:
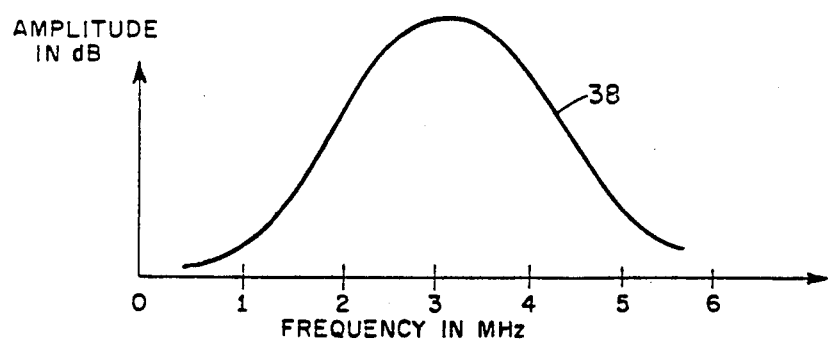
FIG. 4 is a curve showing a typical spectral distribution of the transmitted wave.

FIG. 4 exemplifies a typical spectral distribution of such a transmitted wave 38, in the case of a general-purpose (abdominal) scanner. Signals reflected from the body do not have the same spectrum, however, for several reasons. The most significant reason is that most of the human body atttenuates sound at a rate proportional to frequency. This means that a pulse having many frequencies going into the body will not return these same frequencies in equal proportions. Shallow reflections will produce spectral distributions and pulse shapes similar to the outgoing pulse but deeper reflections progressively distort spectra and pulse shapes so as to favor the lower frequency components.

Figure 5:
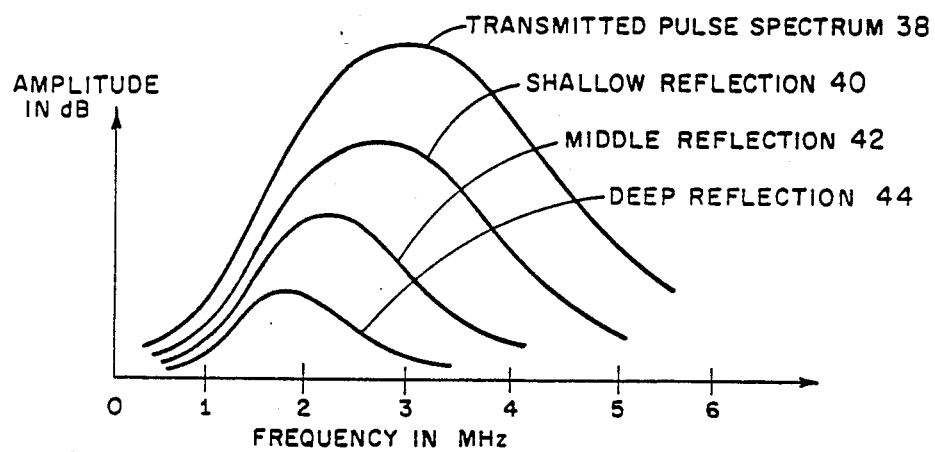
FIG. 5 is a family of curves showing the transition and frequency distribution relative to depth of signal reflection.

FIG. 5 shows that deeper echoes become weaker and have less relative high-frequency components. FIG. 5 illustrates, typically, a single, specific reflection from the kidney (i.e., the same anatomical target, but placed at varying depths), showing the shallow reflection spectrum 40 to be like the superficial reflection (at a 3-cm depth) of a kidney transplant patient. FIG. 5 also shows the middle reflection 42 to be like the kidney image (at a 6-cm depth) of a very thin person and shows the deep reflection 44 to be the same kidney feature (at 13-cm depth) in an obese patient. The purpose of this discussion is to illustrate that the acoustically detected signature of a known uniform (overall depth) anatomical feature changes with depth and that recognition of this fact has to be incorporated in the signal processing section of an ultrasound scanner to produce an image having the least possible artificially induced feature variance with depth.

Figure 6:
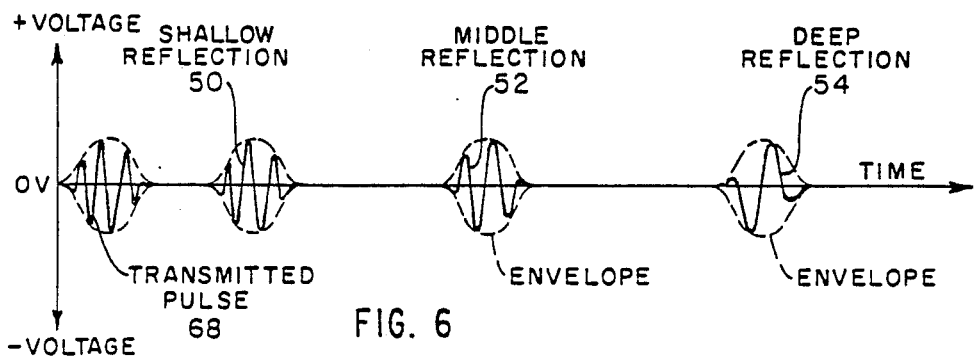
FIG. 6 is a sequence of waveforms showing the time domain signal corresponding to FIG. 5.

FIG. 6 summarizes the same events in the time domain. The shallow reflection 50 has a waveform approximating the transmitted pulse 48. The middle reflection 52 and the deep reflection 54 show a progressively lower "carrier frequency" with increasing depth, while preserving a roughly constant envelope shape and duration.

The combined interpretations of FIGS. 5 and 6 lead one to believe that the envelope characteristics are related to the percentage bandwidth (the "Q") of the crystal; however, the sliding frequency characteristics of echoes summarize the human body's "modulation" of an initially high "center ringing frequency" related to the fundamental frequency of resonance of the crystal.

As in any communications system, the pulse-echo cycle involving the human body both as signal source (echo) and transmission medium must be optimized in the "maximum channel capacity" sense. This concept maximizes the amount of retrievable imaging information. Specifically, both the two-dimensional spatial resolution and the dynamic range (signal-to-noise ratio) must be simultaneously optimized. Fixed focus crystals come much closer to optimizing both resolution and dynamic range simultaneously than do, for instance, phased-array transducers. Also, fixed-focus crystal scanners can be commercially implemented at a lower cost, resulting in a higher image quality-to-dollar ratio.

Figure 7:
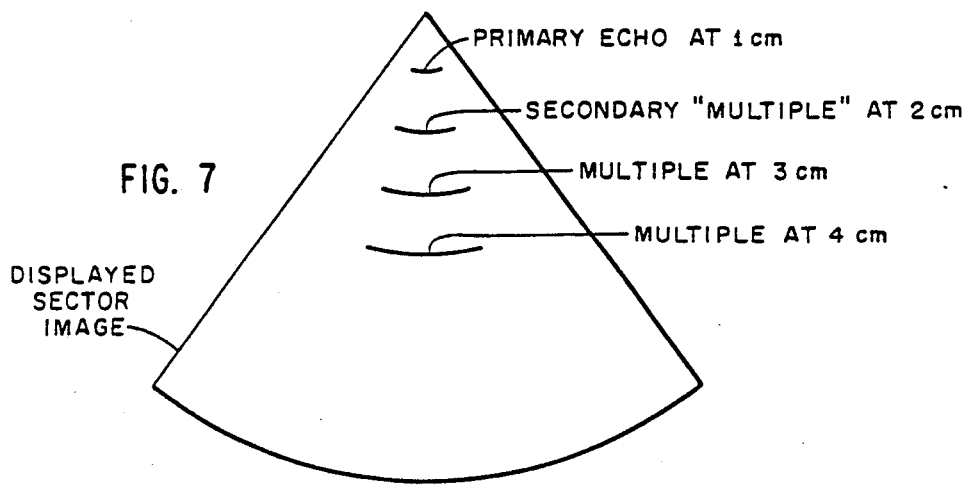
FIG. 7 is an illustration showing multiple reflection signals.

Unfortunately, the price paid in fixed focus crystal systems is that a moving crystal is usually mounted away from the skin surface in a liquid filled bath of 6 to 40 mm. A typical mechanical probe of the sector scanning type (20 of FIG. 1) will employ an internal standoff of about 1 cm. The presence of such a standoff (a practical necessity to keep the oscillating crystal from contacting the patient) causes a primary acoustical reflection in the displayed image at a range of 1 cm, and decreasing amplitude "multiple" reverberations at 2, 3, 4 cm, etc., as summarized in FIG. 7.

Such "multiple" echoes are due to the fact that the first reverberations (from the inside of the front cover) are not completely absorbed by the crystal. The crystal absorbs only part of the first reflection; the remaining energy is re-emitted as though it were a second pulse, and the cycle repeats itself in an exponentially decreasing fashion. When the probe contacts the patient, the first reflection from the front cover greatly diminishes due to the coupling to the patient, and the entire multiple echo-train likewise diminishes; however, the diminished multiples can and frequently are present within the anatomical image at an amplitude ($-20$ to $-30$ dB) high enough to confuse diagnostic interpretations.

Figure 8:
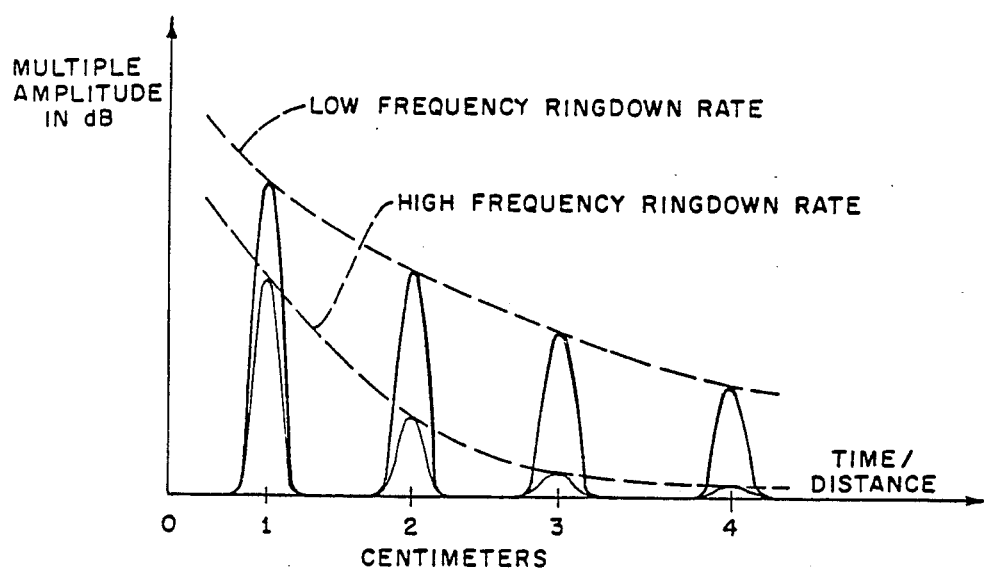
FIG. 8 is a graph showing the relative decay rates of multiple reflection signals of FIG. 7.

However, the physics of multiples differ from the echo events in the patient because of the liquid in the probe. Virtually every liquid commonly used in mechanical probes has an acoustical absorption proportional to the square of the frequency, whereas the acoustical absorption in the patient is proportional to the first power of frequency. If one were to examine the multiple echogenicity at a high frequency and then at a low frequency spectral region, one would observe an entirely different rate of decay of the exponential series as shown in FIG. 8. By combining the notion that multiples can be suppressed by making the receiver insensitive to low frequencies for shallow depths with the idea that the body tends to be frequency-selective on a descending scale vs. depth, one can maximize the "patient information to multiple clutter ratio" by operating the receiver at a fixed bandwidth that slides from a high passband to a low passband frequency mode during each pulse-echo cycle.

The sliding-frequency, fixed-bandwidth receiver mode can also be explained in the context of a "transmission line." The effect of the tissue on the impulse response of the crystal in the body-machine interaction, if viewed in the transmission line context, can be viewed as a classic case of envelope reconstruction; i.e., the information "pixel" packet can be approximated as a continuous wave (CW) carrier multiplied by either a Gaussian envelope or by a $(\sin kt/t^n)^2$ envelope. In practical "television" art terms, the events are comparable to receiving the same picture information (rise-time, axial resolution, etc.) on a channel carrier that progressively slides downhill. The practical implication to ultrasound is that a constant absolute bandwidth (having constant axial resolution) is consistent with the relatively constant envelope lengths 50, 52, 54 of FIG. 6, and that the descending carrier frequency vs. depth due to tissue signature modulation is consistent with a downward sliding receiver retuning vs. echo time. By employing a movable frequency fixed bandwidth desig, shown as filter passbands 60, 62, and 64 in sequence, of FIG. 9, one obtains the optimum axial resolution vs. video noise tradeoff; moreover, the presence of skirts creates the low-frequency stop-band to suppress nearfield multiples 66 and creates the high-frequency stop-band to reduce imaging noise 68 in the extreme far field.

Figure 10:
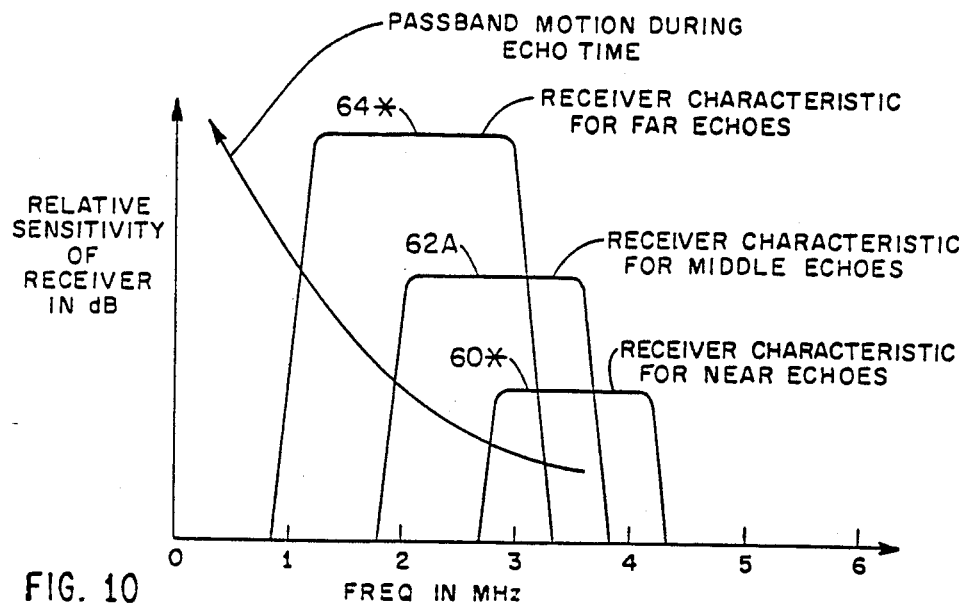
FIG. 10 is a sequence of frequency curves showing the variable bandpass concept combined with the time-gain compensation.

Of course, during any imaging, the gain of the receiver is increased during the echo time so that weaker deeper echoes are amplified more than the stronger shallower echoes. This dynamically varying gain, presently currently used commercially is called "time gain compensation"0 (TGC). When applied along with the concept according to the present invention of a movable passband, the cumulative receiver performance can be summarized in the bandpass curves 60A, 62A, and 64A of FIG. 10.

Additional advantages from the use of the sliding-frequency fixed bandwidth receiver mode arise in conjunction with the ultrasound transducer crystals. The ultrasound crystals designed to operate at a low frequency (e.g. 2.6 MHz) are capable of operating at higher frequencies (e.g., 3.9 MHz) with reduced conversion efficiency. However, such a crystal is nevertheless capable of the higher azimuthal resolution associated with higher frequency processing. By employing a crystal cut to favor the low end of the frequency range (below the frequency of the transmitted signal in CW systems), one is able to optimize the receiver-crystal farfield performance and to minimize subtantially the needed variation required in the TGC gain vs. time control function. Being able to reduce TGC is important, because it reduces systems costs and minimizes intermodulation distortion in the receiver's front end. This fact in itself is very important, because frequently a large (thick) reverberation in the body at moderate depths contains sufficient low-frequency content to distort the receiver's function so that thin, delicate anatomic line features are masked from view due to intermodulation distortion when TGC reduces receiver gain significantly. In other words, by designing a signal-processing channel that does not require as much TGC control, the overall signal-processing fidelity also improves with a given amount of hardware: alternatively, an excellent receiver (with fewer TGC-controlled stages) can be built with less hardware to attain reasonable image quality.

Figure 11:
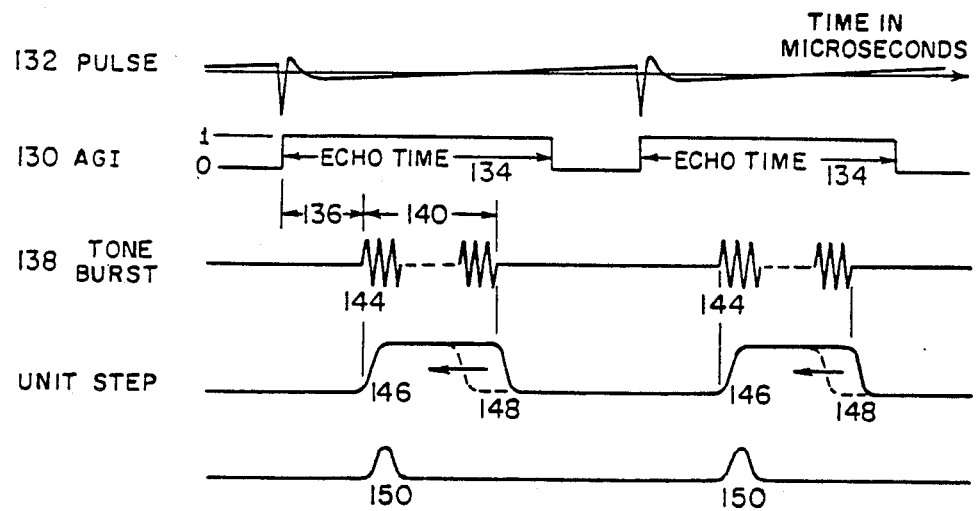
FIG. 11 is a sequence of waveforms of several signals of the present invention.
Figure 12:
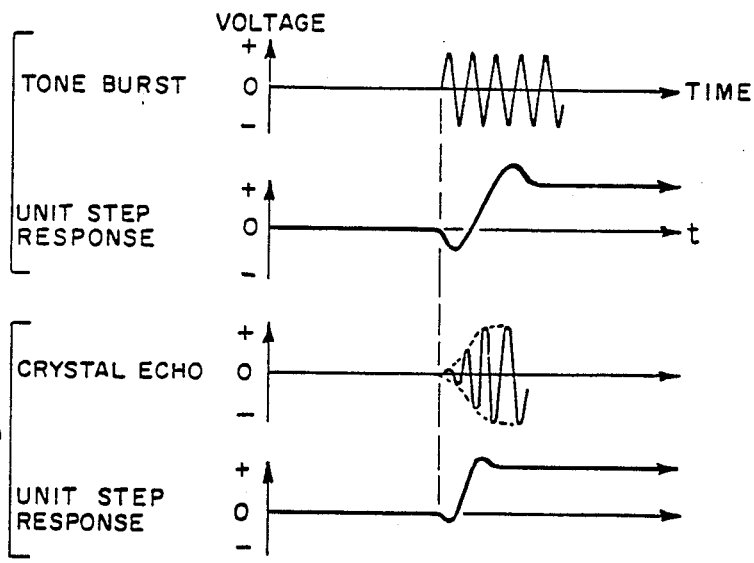
FIG. 12 is a collection of waveforms showing several signals related to the transducer operation.

A further concept in variable-frequency ultrasound systems according to the present invention is selecting a tone burst of a particular duration and selecting a transceiver system impulse to produce a detected signal which is inherently deconvolved (the appliation of phase-synchronous tone burst). Looking at FIG. 11, the Active Gate Input (AGI) pulse 130 is a kind of a master timer signal that initiates the onset of the pulse 132, defines the echo time 134 and starts the delay gate time 136. The tone burst 138 is a substitute test signal that simulates an idealized single ultrasound echo. The duration 140 is adjustable, the tone-burst frequency is adjustable, the delay gate 136 is adjustable; but the phase of the start of the tone burst is always fixed with regard to the end of the delay gate time 136. Whenever the tone burst starts, 144, the final receiver (video) output 146 occurs. A long time burst 138 results in the conventional "unit step" video response. A short tone burst (e.g., 3 cycles at 3.5 MHz) closely approximates a "squared-off" ultrasound echo. The tone burst 138, shortened to 3 cycles, causes the tail end 148 of the unit step response to move back in time until the two halves form the axial impulse response 150. Demonstrating unit step responses that shrink into axial impulse responses constitutes important tests to characterize ultrasound receiver functions. For instance, one normally designs the until step response to be overcompensated on a "squared-off" attack tone burst to end up with an "equalized" response to an actual onset attack coming from a crystal echo signal as summarized in FIG. 12.

This abbreviated discussion describes the acceptable transient response for any variable frequency tracking receiver designs. At first glance, one might expect an electronically tuned (varactor diode variety) single second-order resonant circuit filter to be a satisfactory method of achieving the movable bandpass of FIGS. 9 and 10. This is not the case because the tunable second-order filter has the wrong transient response, as illustrated in FIG. 13.

Figure 13:
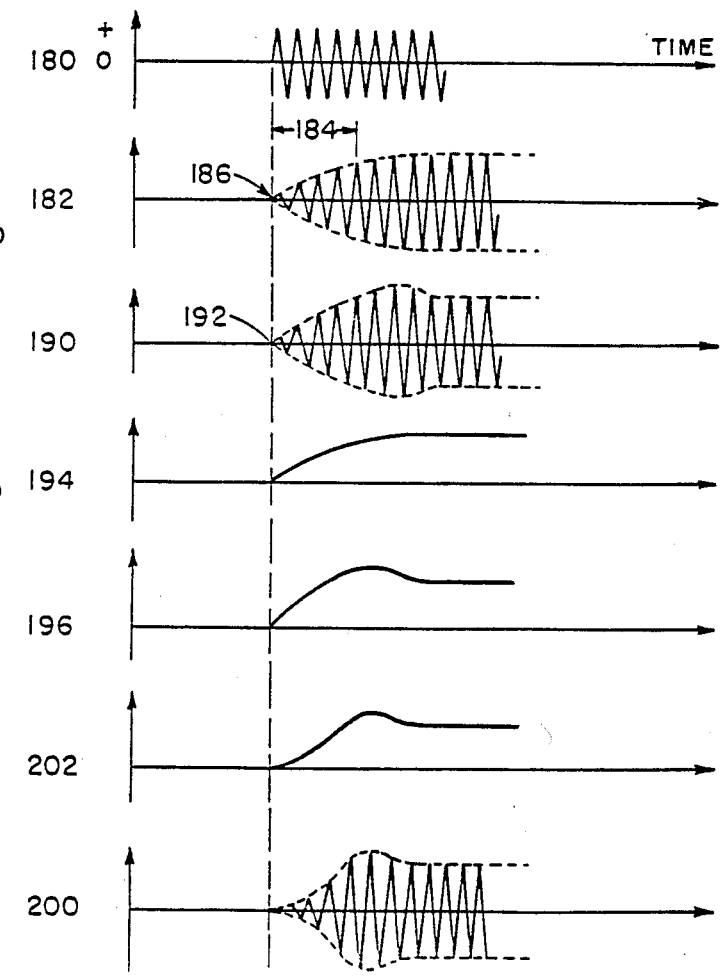
FIG. 13 is a collection of waveforms showing the effect of various filters on the transducer signals.

Referring to FIG. 13, a phase-synchronous tone burst 180 excites an envelope 182 having a $$\left(1 - e^{\frac{t}{t_o}}\right)$$

multiplier when the bandpass is restricted by a center-timed second-order resonant filter. Although the rise time 184 can easily be scaled to render the proper axial resolution, the slope discontinuity 186 creates insurmountable (derivative-depenent) post-processing video enhancement problems. Even when the second-order filter is mistuned, as at 190, the slope-discontinuity prevails (192), and the 0th-order video signal 194, 196 is always slope-discontinuous. However, if a high-order (e.g. sixth-order) bandpass filter is used, the envelope response 200 is slope-continuous, and the resulting video 202 is also slope-continuous. In other words, an elegant (nth order) bandpass filter is preferred because it preconditions all receiver echoes in such a way that a slope-discontinuous video output is impossible, i.e., the signal can always be deconvolved by a lead-function one derivative operator lower than the order of the effective bandpass filter function. The practical visually perceived counterparts of these principles are emphasized in FIG. 14.

Figure 14:
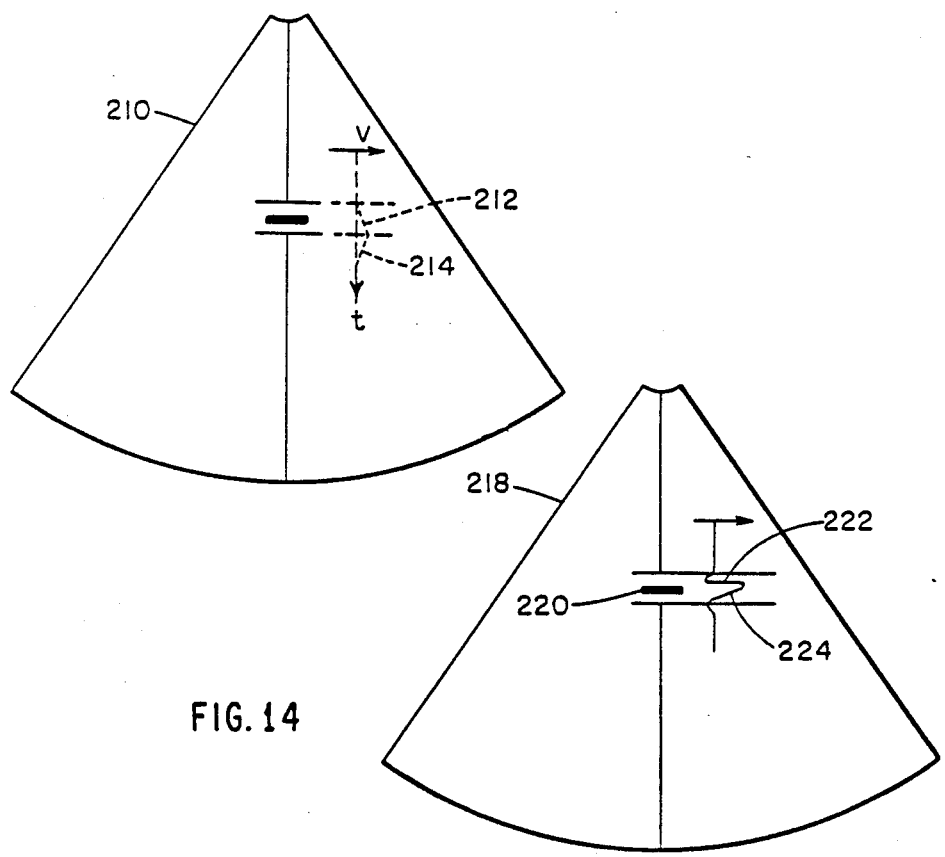
FIG. 14 is a drawing which illustrates a point spread function.

The upper trace 210 of FIG. 14 illustrates a video signal originating from an (improper) second-order bandpass filter. The axial extent of the point-spread function is elongated by the two $$\left(1 - e^{\frac{t}{t_o}}\right)$$

multipliers 212, 214, and is generally smeared vertically (in time). the lower trace 218 shows a much sharper axial imaging of the point spread function 220 with the corresponding quicker attack 222 and decay 224 portions of the video waveform. The video performance of 218 can be obtained by the use of high-order filters having the same (10–90 percent) cumulative rise time as the single second-order filter because the slope continuity of the latter case permits post-video detection deconvolution to at least the first two derivatives. From a practical point of view, the best axial characteristic of a point spread function is a "blip" whose height approximates the desired axial resolution (about 1 mm) and contains very slight (−10 percent) symmetrical shadow troughs above and below the center of the blip.

Figure 15:
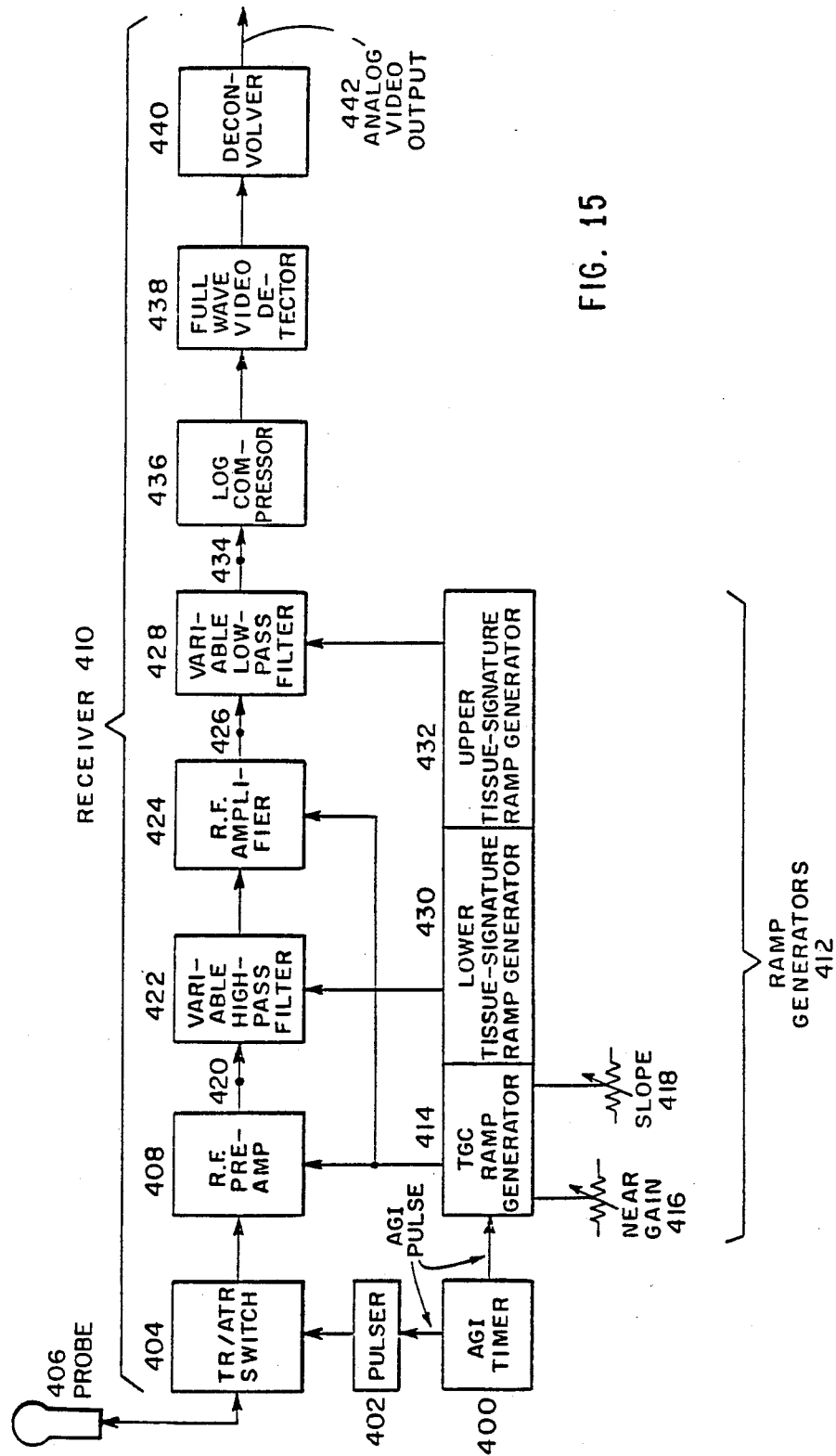
FIG. 15 is a block diagram of one embodiment of the movable passband receiver according to the present invention.

FIG. 15 illustrates a preferred system configuration for a baseband-RF movable passband receiver. Since the objective of this receiver is to correct the signal processing for the most significant average effect the body tissue has on the ultrasound pulse (summarized in FIG. 5), the name adopted for such receivers is "tissue signature tracking receivers." A basic design of the receiver according to the present invention is shown in FIG. 15.

Referring to FIG. 15, the AGI timer 400 triggers the pulser 402 that sends an avalanche breakdown pulse into the transmit-receive/anti-transmit receive (TR/ATR) switch 404. This switch 404 connects the probe 406 to the pulser during the pulse. During the time that echoes are received by probe 406, the switch 404 disconnects pulser 402 and connects probe 406 to the input stage 408 of the receiver 410. Meanwhile, AGI timer 400 triggers the ramp generators 412. The first ramp function, the time-gain compensation (TGC) ramp 414 applies a sawtooth shaped wave to gradually increase the gain of the preamplifier stage 408. The DC bias and slope of the TGC ramp are controllable by panel potentiometers 416, 418. At this point, RF echo signals produced at point 420 are unfiltered and partially compensated in gain (the gain is partially boosted to increase the amplitude of deep echoes), the signal at point 420 tends to have predominant low-frequency components (e.g. in the 1.5–2.2 MHz range). By applying a time-adaptive high-pass filter 422, the higher amplitude low-frequency components are attenuated before they can overmodulate the next RF amplifier stage 424. The TGC gain control waveform is also applied to amplifier 424 to complete the job of balancing the near-and-far echoes to approximately the same signal levels. The variation in gain during echo time is about 20–25 dB up to point 426, or about 10–13 dB per stage. The signal at point 426 is time-adaptively low-pass filtered at 428 in such a way that the remaining passband squeezing through filters 422 and 428 is of a constant width and slides downward in frequency with time. The lower and upper tissue signature ramp generators 430 and 432 produce appropriately proportional waveforms to cause the filters 422 and 428 to track properly. The signal at point 434 is symmetrically logarithmically compressed at 436 to compress the tremendous variation (50–60 dB) in echo amplitudes into a smaller amplitude range (B 25–30 dB) more suited for envelope detection at 438 at reasonable (5–10 V pp) signal levels. Video detector 438 employs a second-harmonic carrier suppression filter (in the 4.4- to 7.0-MHz range) and a low-pass filter (700–1200 KHz) to limit the rise time to one-half pixel height. Further enhancement and deconvolution of the video signal is done at the deconvolver stage 440, also known as aperture correction. The analog video output 442 is fed to the main display system; may be flash-digitized; entered into a scan-converter; or presented as an A-mode trace on an auxiliary monitor.

Figure 16:
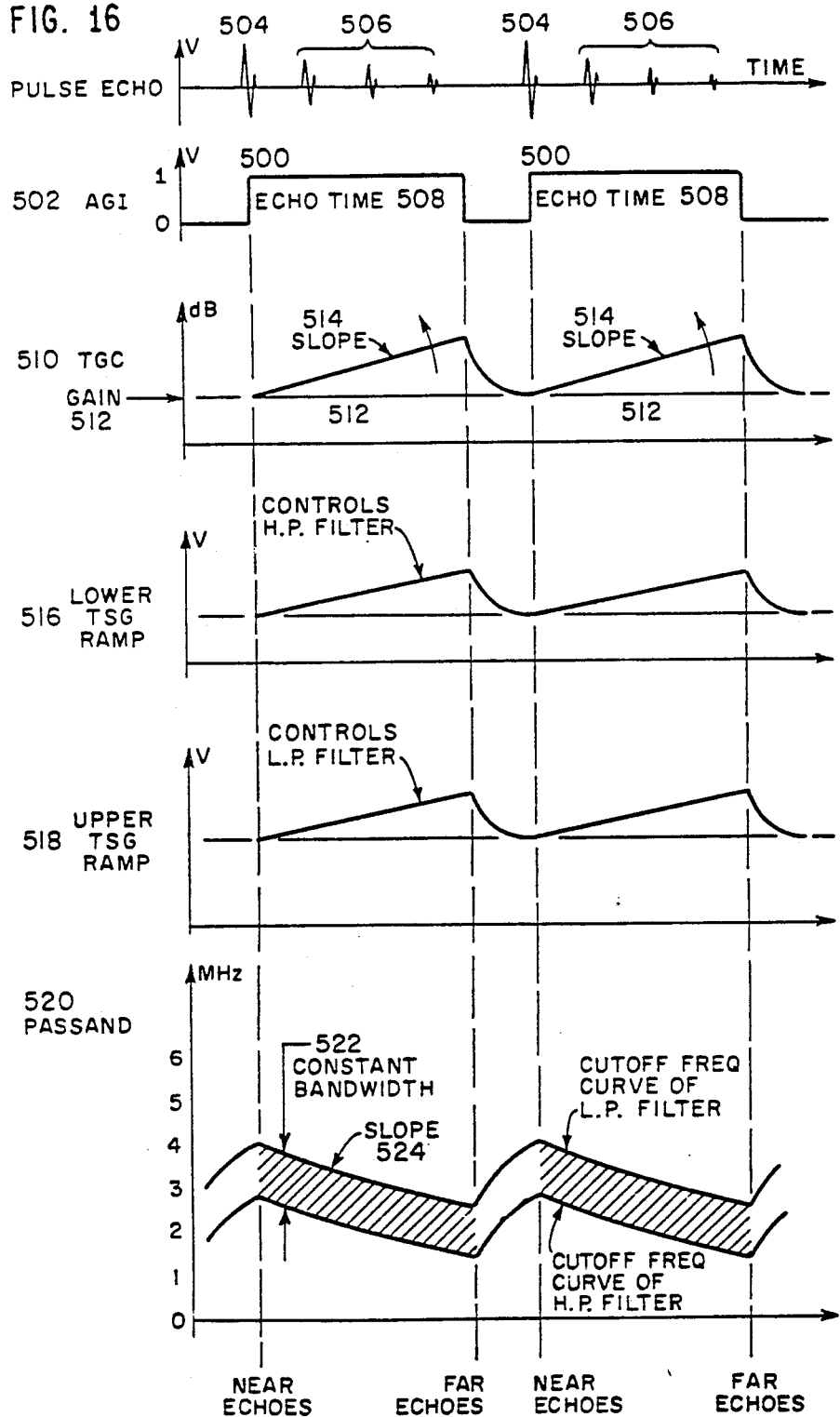
FIG. 16 is a collection of various waveforms of the system of FIG. 15.

The waveform curves of FIG. 16 summarize how the various signals work together. The positive leading edge 500 of the AGI timing pulse 502 initiates the outgoing acoustical pulse 504. Echoes 506 occurring during echo time 508 have a generally decreasing amplitude vs. echo time. The TGC ramp function 510 boosts gain during echo time, and then resets to the lower gain value during the next pulse as controlled by the gain 512 and slope 514 control settings. Meanwhile the lower TSG ramp function 516 and 518 control the time-varying filters to create a constant bandwidth passband 520 that descends in frequency with echo time. All filter functions reset themselves to their initial values during each subsequent pulse. The width of the passband 522 determines the axial imaging resolution and the downward slope 524 determines how the receiver tracks the decreasing frequency spectrum vs. echo depth due to the tissue signature effect.

Figure 17:
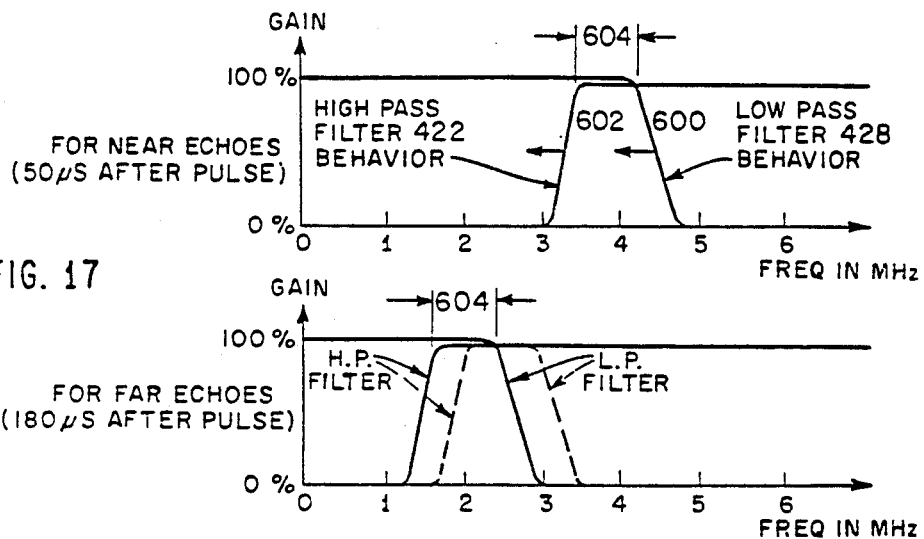
FIG. 17 is a collection of curves showing the moveable highpass and lowpass filter curves of the system of FIG. 15.

FIG. 17 provides another interpretation of how the two filters track in time. The cutoff 600 of the low-pass filter is actually higher than the cutoff frequency 602 of the high-pass filter by an amount equal to the effective bandwidth. As the echo time progresses from 50 to 80 us after the pulse (progressing from near to far echoes) both filters 428, 422 are constantly "reprogrammed" by ramp functions 432, 430 so that both cutoff frequencies slide downward to preserve a constant difference between them 604. The constant bandwidth tracking filter design is accomplished with a "partitioned" approach for several reasons. If a single filter with movable bandpass were implemented, there would be difficulty in changing the slope of the lower skirt without affecting the upper skirt. A partitioned approach, employing two adjustable filters with a buffer amplifier in between is much easier to design and to adjust at the testing stage. If one chooses to make the width of the effective passband variable, the partitioned method very easily allows for this approach. If the shape of one or the other ramp function were modified, this changes the bandwidth. There are imaging applications in which a reduced bandwidth at great depths in exchange for a better signal-to-noise ratio is the preferred mode. Conceivably, the offsets between the two ramp functions could be at the disposal of the operator who could dial or program the tradeoff between axial (and azimuthal) resolution and dynamic range. An example of this approach occurs when scanning the carotid arteries (in the neck). During the initial survey of the scan, the operator might prefer a very wide bandwidth (high axial resolution, a sharp image) to identify the detailed architecture of vessel walls (each branch of the carotid artery has four surfaces to be identified). Once a suspicious plaque had been identified, the operator might prefer to go into a reduced bandwidth mode (resulting in "softer" edges) in exchange for a higher signal-to-noise ratio and greater display dynamic range in order to classify the plaque and to differentiate it among various stages of blood clot.

Figure 18:
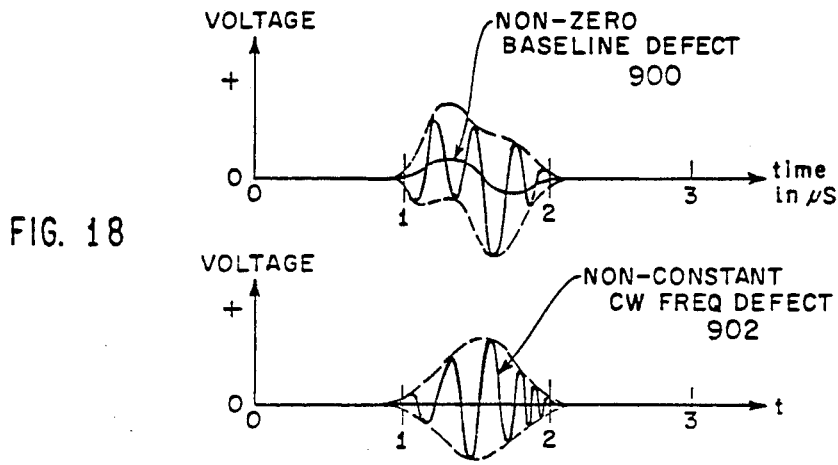
FIG. 18 is a collection of signal waveforms illustrating typical signal defects.

An additional feature of the present invention is the development of synchronous baseband RF detection. When one places a transducer against the human body and stops the scanning action, so as to repetitively pulse-and-echo the same line of imaging information, an A-mode presentation of this information (similar to FIG. 6) has surprisingly good phase-synchronous qualities. The ultrasound echo train will be many overlapping echoes. Each anatomical reflecting surface (or acoustical impedance discontinuity) will produce echoes which are approximately single-frequency CW packets inside of Gaussian multiplier envelopes. The error is that frequently the "CW wave inside the envelope" may not have either an absolutely "zeroed" baseline, shown by waveform 900 of FIG. 18, or may not have a constant CW frequency, as shown by waveform 902.

The ultrasound imaging "pixel" is recoverable fully by envelope reconstruction (i.e. timing to the average frequency (function of depth) and perfectly detecting the (symmetrical) envelope). The nonzero baseline defect 900 and the nonconstant CW frequency defect 902, of course represent information, but for the next coming generation of imaging refinements, can be eliminated to simplify signal processing steps within the (narrowly defined) envelope reconstruction model. The most practical method to eliminate defects 900 and 902 is to truncate the receiver passband by employing fairly steep (6th to 8th order) skirt selectivity in the cumulative bandpass filter function prior to detection. When one forces the echo train to fit in the model of zero baseline and constant CW frequency (per echo), the only dynamically changing feature of the entire echo train is that among hundreds of echoes, only the CW frequency slowly slides downhill, parroting the grossest body tissue signature physics (FIGS. 5 and 6). When one simply envelope-detects an echo train "laundered" of defects 900, 902, the resulting video information, although narrow banded, leads to images generally superior to totally conventional (broadband or TRF) processing. However, an echo train, laundered of defects 900 and 902, presents a wonderful opportunity to recover motion-related information, owing to its outstanding phase-synchronous characteristics.

However, according to the present invention, when one thinks of the "phase synchronous" concept in new light, significant improvements in ultrasound transceiver are made, as discussed as follows. Assume that a "reference signal" was started or "kicked off" exactly at the same phase angle every time AGI came up, as shown in FIG. 19, regardless of whether successive AGI pulses occur at a regular repetition rate.

If the imaging signal processing were to function on a $T_1$ time basis, and forgetting about nonuniform "dead times" $T_2$, the system would act as though it were totally phase-synchronous in the CW sense, even though there is random phase breakup during nonconstant times $T_2$. The "phase synchrony" during $T_1$ can easily be displayed on an oscilloscope simply by triggering the scope to the positive-going edge 906 of AGI 908. It is important that an ultrasound signal processor be able to operate on an AGI-asynchronous basis (nonconstant $T_2$) because many commercial scanners do and will operate on what is known as "demand pulsing" (i.e., wait until the crystal beam is exactly where it is desired, and then initiate the pulse (AGI)).

Figure 19:
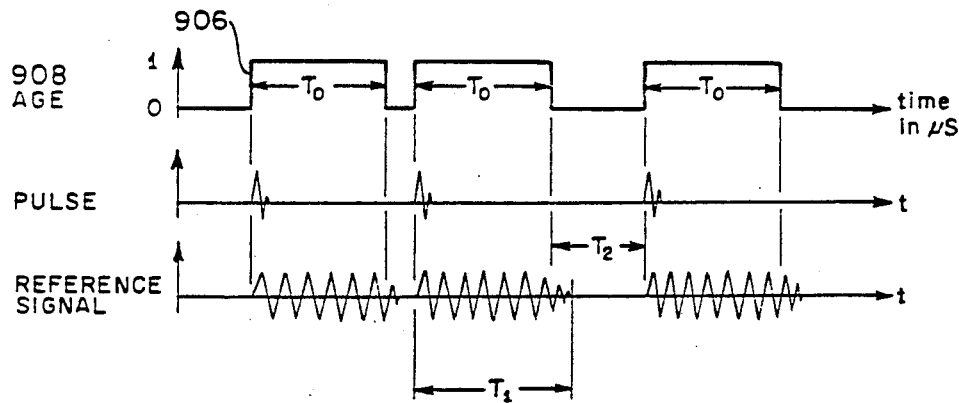
FIG. 19 is a group of signal waveforms showing the alignment of a pulse signal and a reference signal according to the present invention.
Figure 20:
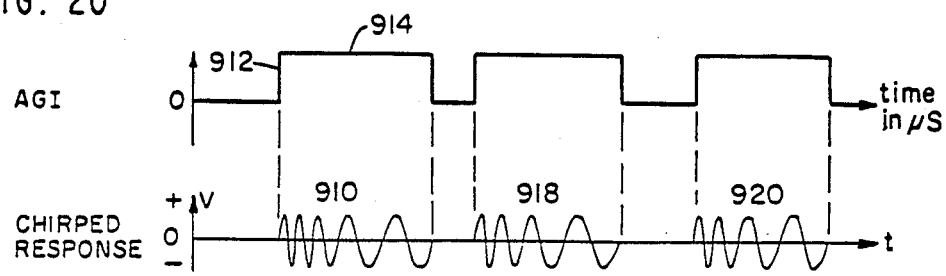
FIG. 20 is a collection of waveforms illustrating the sliding frequency reference pilot signal.

Although FIG. 19 describes a phase-synchronous gated fixed-frequency reference signal, a much more useful concept is the phase-synchronous gated slow chirp sliding frequency reference signal. See FIG. 20. This reference wave 910 "kicks off" exactly synchronously with the positive going edge 912 of each AGI pulse 914. In addition, the reference wave 910 slides downhill gradually in exactly the same way each time (910, 918, 920) it gets "kicked off." It is useful to think of wave 910 as a kind of "skeleton model" of the much more complex echo train.

Figure 21:
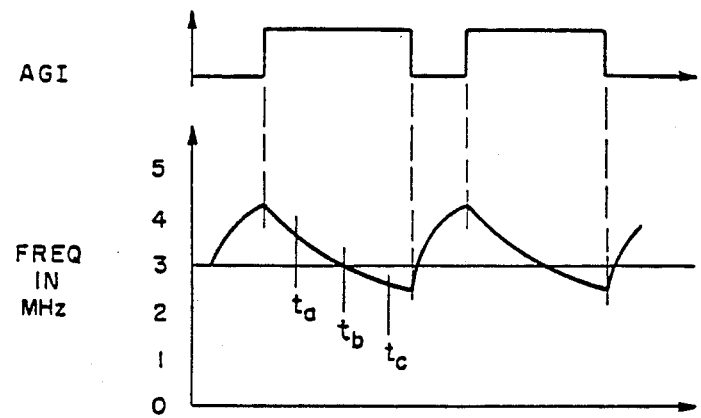
FIG. 21 is a collection of curves showing a plot of the time-frequency modulation of the reference pilot tone.
Figure 22:
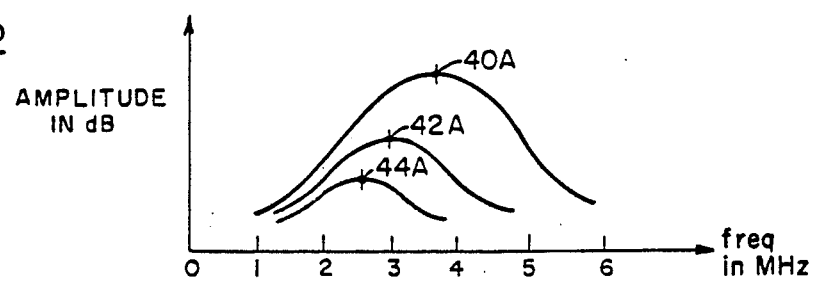
FIG. 22 is a collection of curves showing the motion of the spectral peaks of acoustic reflection corresponding to the change in pilot tone shown in FIG. 21.

According to one embodiment, the transceiver of the present invention uses the reference wave as a pilot tone to directly interact with incoming radio frequency (RF) signals at the baseband frequency. A pilot tone is programmed to have a frequency-time modulation curve as shown in FIG. 21. The pilot tone frequency at times $t_a$, $t_b$, and $t_c$ corresponds to the spectral peaks of acoustical reflections 40A, 42A, and 44A in sequence, of FIG. 22, from the human body coming back at the same corresponding times.

According to the present invention, a pilot tone corresponding to the expected CW component of any specific echo at any specific depth is generated. If the pilot tone only roughly approximates the CW frequency of the echo, a very good reading of the "phase status" of that echo can be taken because each echo contains very few (e.g. 3) cycles of radio frequency. For instance, if the pilot tone 150 of FIG. 23 is "product detected" (multiplied by the echo and LP-filtered) with the echo 152, a number of output 154 (or no output) signals are possible.

Presentation of the pilot tone 940 only during a few microseconds makes it appear as a fixed frequency relative to the duration of the RF echo signal 942. If the two waves happen to be "in-phase," the product detector output 944 results. If the pilot tone and signal are out of phase, 946 results. If the pilot tone and signal are in quadrature, no output results. if the signal is represented as a phasor (see FIG. 24), the product detector outputs 944, 946, etc. can be thought of as the cosine projections of the envelope.

In FIG. 24, the echo phase 950 is shown not perfectly in phase with the pilot tone 952, so the cosine mechanics can be seen. To correspond exactly with the waves 940, 942 (of FIG. 23), one would have to rotate the signal 954 towards the real axis 956. The product detector outputs (PDO) of FIG. 23 are like the conventional video signal with these exceptions: (1) PDO may be bidirectional; (2) PDO may be zero event even in the presence of a strong reflection; and (3) PDO "whips up and down" wildy for the slightest amount of motion (approximately 0.1 mm) of the reflecting anatomy relative to the transducer crystal. Since for every cosine there is a corresponding sine, the null outputs 960 of FIG. 23 can be remedied by duplicating the detection process. If the pilot tone 940 is phase shifted by 90° for all frequencies used during the "chirp" of the pilot signal, one could employ both the original and phase-shifted pilot tone to operate two product detectors to produce both the sine and cosine component outputs as suggested in FIG. 25.

The phase angle of the echo signal 970 is unpredictable. By making a receiver for which the phase angle is irrelevant, one can gather both the amplitude and phase information contained within each pixel without requiring the receiver to identify zero crossings in signal or worry about locking any oscillator into an incoming carrier. Therefore, the receiver according to the present invention is a "nonthresholding" receiver, which performs smoothly as the received signal drops into the noise level of the receiver noise signals. The present invention therefore provides information for diagnostic imaging even as the signal-to-noise (S/N) ratio drops below 0 dB. The outputs of this receiver are the two product detector outputs, and both conventional (unidirectional amplitude) video and motion-related imaging information can be derived from these two outputs.

Figure 26:
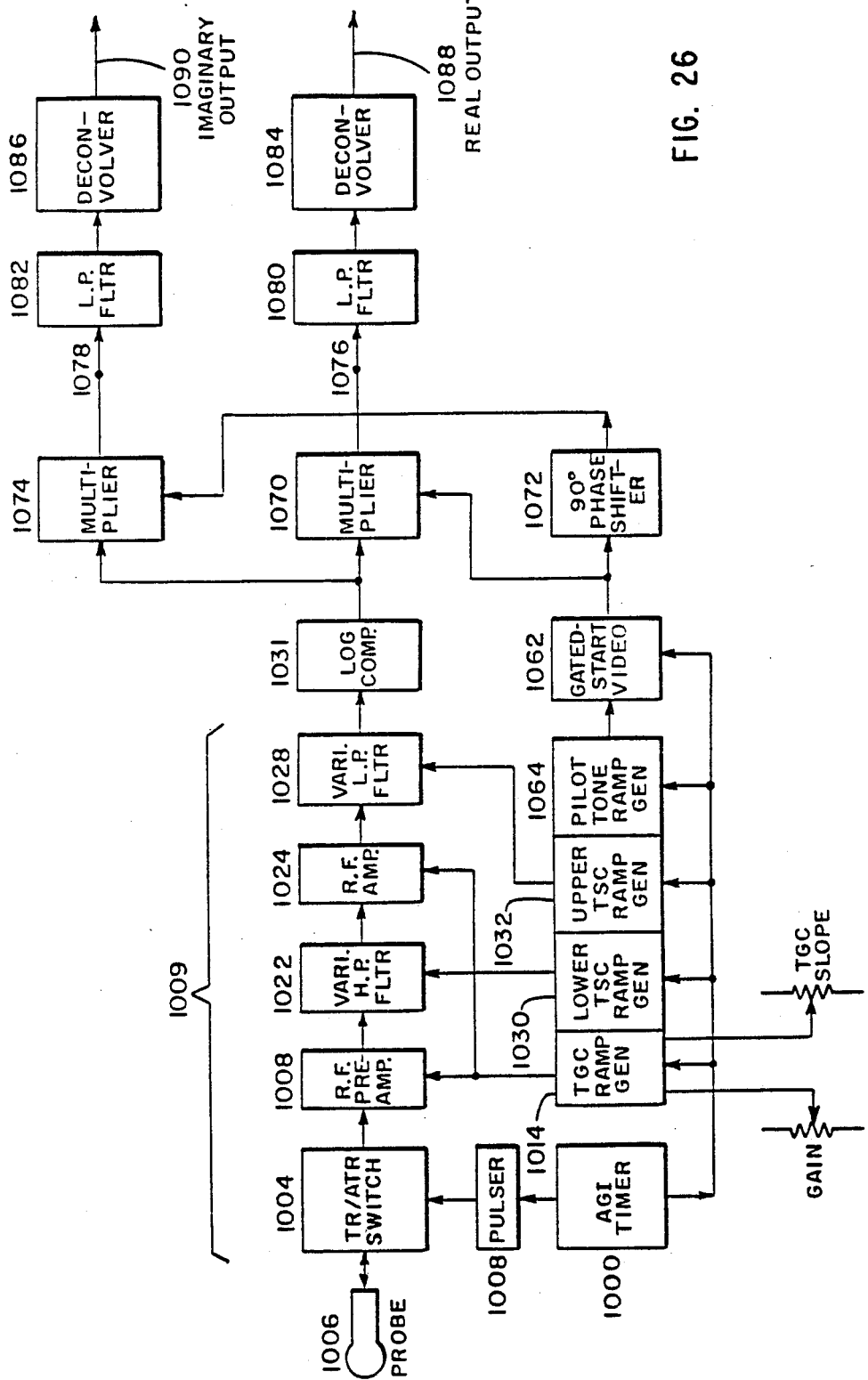
FIG. 26 is a block diagram of a second embodiment of the ultrasound tranceiver according to one embodiment of the present invention.

FIG. 26 shows how to implement this receiver. The front end blocks 1000, 1002, 1004, 1006, 1008, 1014, 1022, 1030, 1024, 1032, 1028, and 1036 of FIG. 26 work in the same way that blocks 400, 402, 406, 408, 422, 430, 424, 432, 428, and 436 of FIG. 15 do. An additional output 1060 of the AGI timer 1000 feeds into the gated-start VCO 1062 to "kick it off" in the correct phase when AGI comes up. An extra "pilot tone" ramp generator is provided at 1064, whose purpose is to provide a sawtooth waveform at an AGI rate (similar to the TGC and TSC ramp functions) that tunes a varactor-diode operated resonant tank circuit in the pilot-tone VCO 1062. The output from the VCO 1062 is applied directly to multiplier 1070 and through phase shifter 1072 to multiplier 1074. Signals from logarithmic compressor 1036 are also applied to multipliers 1070 and 1074. The outputs 1076 and 1078 are lowpass filtered at 1080 and 1082 and deconvolved at 1084 and 1086 in the conventional manner. The most economical location for the log compressor 1036 is before the multipliers 1070 and 1074 provided that one takes the precaution to reject the fundamental RF component at lowpass filters 1080, 1082. The mathematics for recovering the sine and cosine components in their correct ratios works with the log compressor before the multiplier and all outputs 1088 and 1090 are equally logarithmically compressed.

The alternative design (i.e. using two log compressors after multipliers 1070 and 1074) is more expensive and incurs the problem that the multipliers have to handle 60 dB of dynamic range rather than 30 dB required if the single log compressor is used ahead of both multipliers. In order to recover both amplitude and velocity related information, outputs 1088, 1090 must be post-processed. One preferred method, outlined in FIG. 27, is to digitize both outputs and do the computations through EPROM look-up tables 1118 and 1120.

Figure 27:
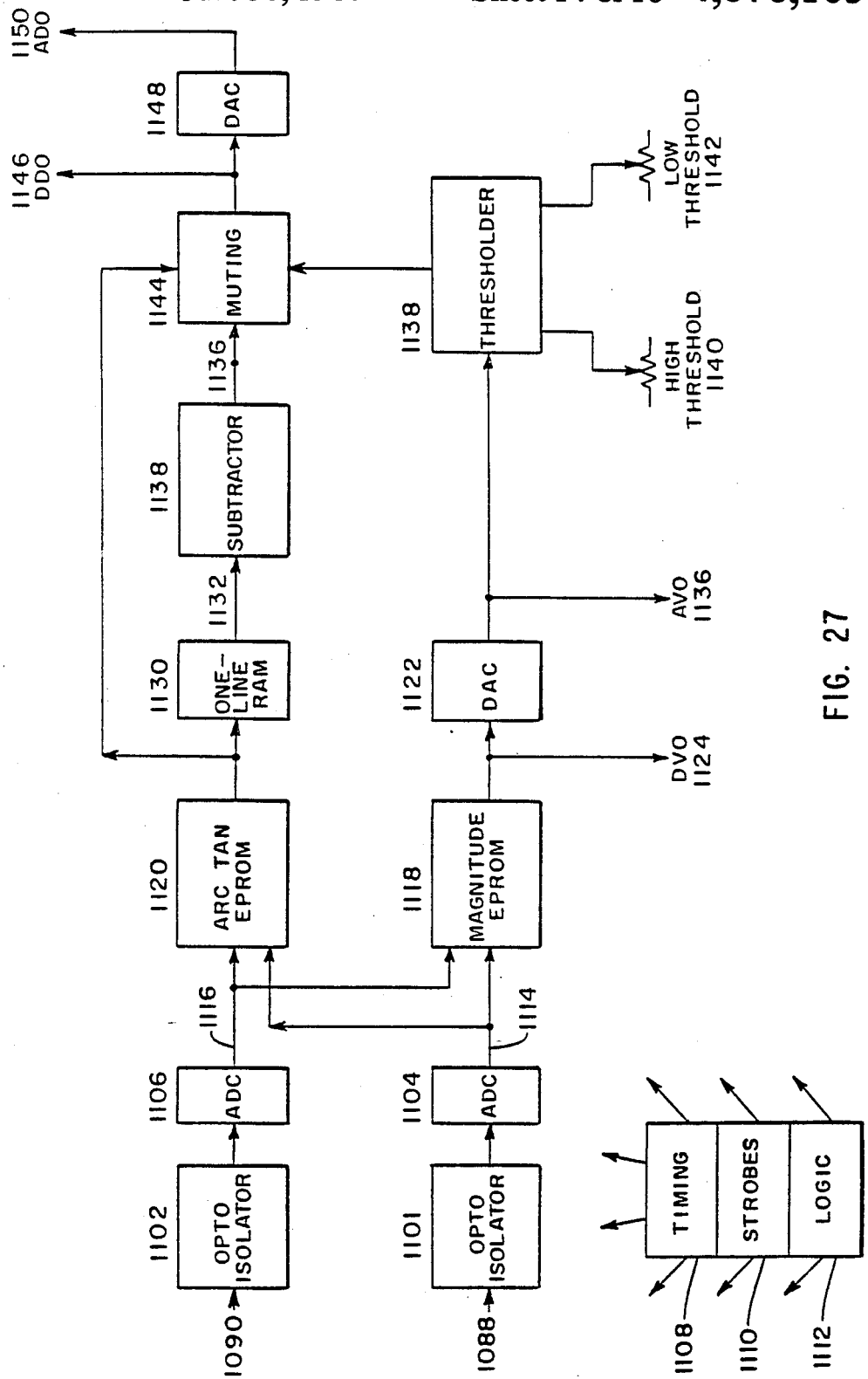
FIG. 27 is a block diagram of a quadrature signal post-processor according to one embodiment of the present invention.

Referring to the receiver post-processor shown in FIG. 27, outputs 1088, 1090 are coupled through opto-isolators 1100, 1102 before being flash-digitized at ADCs 1104, 1106. Routine digital timing 1108, strobes 1110, and incidental logic 1112 is condensed for simplicity in the main signal path. Digital code equivalents 1114, 1116 of the real and imaginary signals are combined so that the sum of all the bits represents the address code inputs for EPROMs 1118, 1120. For every possible combination of real and imaginary echo signal components, EPROM 1118 digitally recalls the code value for the "square root of the sum of the squares" and provides a "Digital Video Output" (DVO) 1124, which is then converted back to analog at DAC 1122 and presented as "Analog Video Output" (AVO) 1126. Meanwhile, the digital codes 1114, 1116 combine to form collective addresses to the arctan EPROM 1120 whose output 1128 is the digital equivalent of the arc-tangent of the real and imaginary signals. Since there is no phase alignment between the chirped pilot tone and RF echo signals, the train of arc-tangent values is a random collection of anglar numbers for any single echo train (line of imaging data). When any echoes move from one AGI time to the next, the arc-tangent values only for those moving echoes change values, and all other values remain the same. In order to detect such motion, on a pixel-by-pixel basis, the entire train of hundreds of pixel-size arc-tangents is stored in the one-line static RAM 1130 (an N-bit substitute) for a shift register, capable of variable-length AGI on-time and is played back with a one-AGI-cycle delay. The delayed playback RAM output 1132 is subtracted digitally 1134 from the next line of pixel-sized arc-tangents, and the output 1136 is a digital equivalent of a bidirectional velocity signal listing all velocity motions continuously down the echo time as a direct motion counterpart of the ordinary A-mode amplitude signal.

Figure 28:
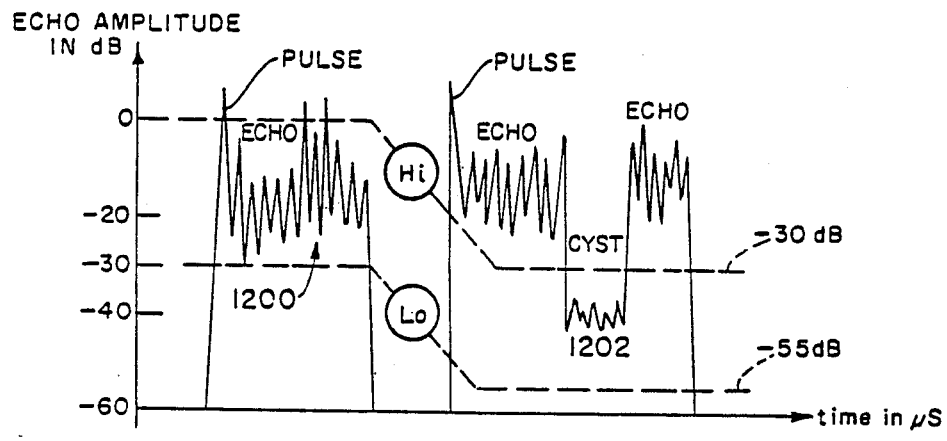
FIG. 28 is an amplitude-versus-time waveform representation of the signals received according to the present invention, distinguishing static features from blood flow velocity information.

In order to determine which velocity data is to be utilized by the display system, a thresholder 1138 with High 1140 and Low 1142 controls is provided. FIG. 28 illustrates its echoes in the 0- to −30-dB range 1200 (after equalizing with the TGC camps) represent anatomical features, while echoes in the −30- to −55-dB range 1202 represent blood flow. If the thresholder controls 1140, 1142 of FIG. 27 are set to 0 dB and −30 dB respectively, digital velocity data 1136 will pass through the digital muting circuit 1144 to allow the "Digital Doppler Output" (DDO) 1146 to be used to display anatomical motion (such as minute pulsations of arteries). DAC 1148 provides an "Analog Doppler Output" (ADO) 1150 so that the velocity signal can be observed along with the amplitude signal on a scope for diagnostic system check purposes.

If the thresholder controls 1140 and 1142 are set to −30 dB and −55 dB respectively, digital velocity data 1136 will pass through the muting circuit 1144 only for very weak echoes that are normally black in the conventional ultrasound impage (0 dB=white, −15 dB=grey, −30 dB=black). The lower thresholder settings (−30, −55 dB) are very useful because they allow the main system imaging this data to differentiate between dark vessels in the image and cystic voids that have loculated (nonflowing) liquid from dark regions having blood flow.

Naturally, the velocity signal is proportional to the magnitude (in cm/sec) of the flow, is bidirectionally sensitive, is proportional to the cosine of the angle between the ultrasound beam and the blood veseel (or anatomical motion direction), and is proportional to the pilot tone frequency.

Figure 29:
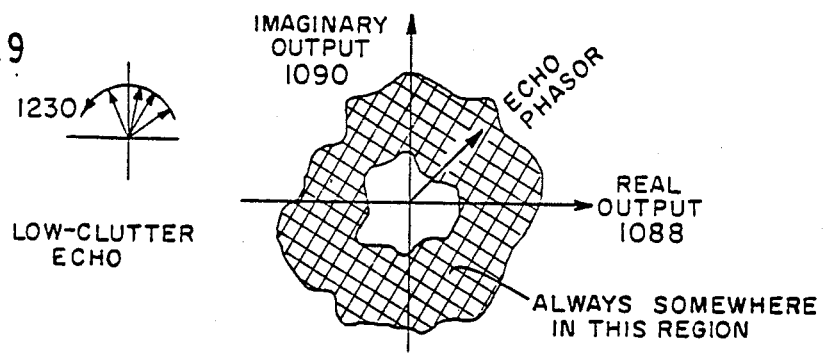
FIG. 29 is a phasor diagram illustrating a low-clutter received signal.

Additional features of the present invention include:

(1) Two or more scanning probes might be used to cover the case wherein one probe is exactly perpendicular to the (site and) direction of motion and suffers a complete null output;

(2) A microprocessor based system that "expands and compresses" the velocity numbers to include the 1/cosine $\theta$ compensation factor between the angle of the beam and the long axis of the blood vessel being imaged;

(3) Digital correction proportional to $1/f_{PT}$ of the pilot tone frequency, to normalize velocity data to a uniform scaling factor along the changing frequencies during the entire echo time;

(4) Digital correction that corrects for different rates of change in the arc tangents due to changes in the pulse repetition ($T_2$) rates of the ACI master timing pulse. One way of minimizing the Doppler aliasing problem is to allow the AGI timer to be agile, i.e., always pulse at the maximum possible rate consistent with the penetration depth selected. The processor described in FIG. 27 is designed for "low clutter" signals. FIG. 29 shows what is meant.

The echo phasor hovers and rotates quite widly, depending upon the motion involved, but is always large enough compared to any interfering signal that it describes a doughnut about the origin of the graph. If the rate of rotation 1230 of the arc tangent is "jittery," it can still be used provided that the average cyclic rotation (one-turn rate) is preserved.

Figure 30:
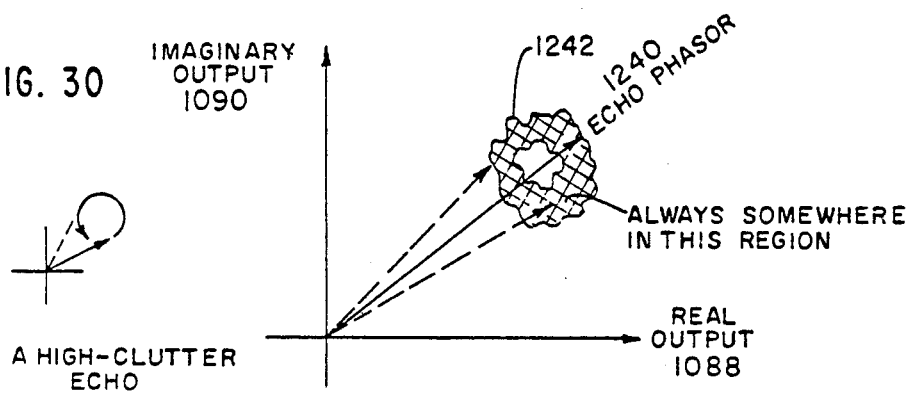
FIG. 30 is a phasor diagram illustrating a high-clutter received echo signal.
Figure 31:
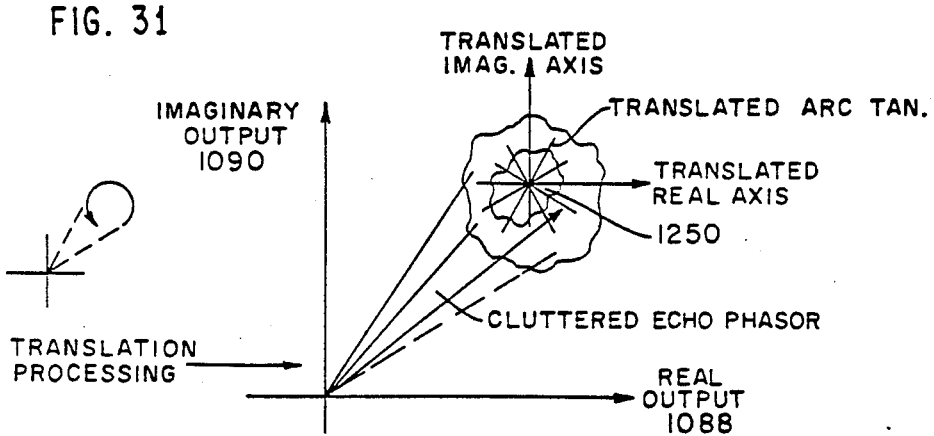
FIG. 31 is a phasor diagram illustrating the quadrature post-processor operation wherein true velocity information is recovered from an otherwise high-clutter signal according to the system of FIGS. 27 and 28.

FIG. 30 shows what is meant by a high-clutter echo. In this case, the echo phasor 1240 is always somewhere in the "Christmas wreath" region 1242 and exhibits an oscillating nature ( envisioned as the drive-rod motion on a steam locomotive). This representation occurs because the echo of interest is smaller than a large (generally stationary) interfering clutter signal (such as a body "multiple" from an earlier imaging feature). In order to retrieve true velocity information from this offset form of circular motion, a digital processor can translate the origin as shown in FIG. 31 which operates as follows.

The echo phasor positions must be stored for several contiguous echoes (same pixel), the average position 1250 computed, and the phasors must have the average value subtracted in order to affect the equivalent of a coordinate translation. Subsequent substration of corrected phasors will restore some velocity information; the quality of this information depends upon how stationary the clutter signal phase happens to be. Remember, the "clutter signal" may not really be clutter, but a different catagory of a velocity signal in itself. From an imaging point of view, it only takes two contiguous (adjacent) imaging lines in a real-time image to recover low-clutter Doppler motion information (e.g., showing blood flow in major vessels). Since scanners normally space display lines closer than the azimuthal resolution distance of the crystal, a 2:1 reduction in motion-azimuthal resolution is hardly a degradation over anatomical imaging. However, motion recovery in the presence of high clutter requires several lines of computation, and this degrades motion-aximuthal resolution by 5:1 typically.

If one were to image anatomy in monochrome (as is done commercially), a very convenient way to image motion is a composite fashion would be to raise the image "in relief" proportional to the flow values. This would give the image a three-dimensional effect where flow is significant. Another way would be to use a series of closely spaced "highlighter" lines in the display that bend to and fro like spider webs in the breeze. In this manner, the familiar parabolic flow profile in an artery could be seen directly.

Another method of composite display is to image the anatomy in monochrome and the motion in color. Suitable color scales can be arrived at that have simple interpretations; e.g., reddish shades could symbolize blood flowing towards the crystal; blue symbolizes flow away. It is important that whatever color scale is used, that the maximum flow value color away from the probe chromatically connects with the maximum flow valve towards the probe, because if this is done, aliases become insignificant distortions in the imaging process. It is also important that the color scale selected goes to black, so that the polychromatic imaging of cysts remains black, as it is currently in commercial monochrome, for zero-velocity conditions.

Color imaging of motion can provide impressive interpretive results, based on what we already know about color television engineering. The eye is quite content to see less color detail (axial resolution, bandwidth, and azimuthal resolution) than monochrome detail. In chromatic ultrasound, it is the monochromatic (square foot of the sum of the square) part that does all of the "work" of producing the image: the (reduced bandwidth-permissible) color velocity component is an aid that categorizes the anatomic feature. The color detail can be about one-fourth as dense as the monochrome detail before the eye discerns the loss of information. In the event of high cluter contaminaion, for instance, a moderate amount of reduction in azimuthal resolution is well tolerated.

It should be noted that the use of processors of FIGS. 26 and 27 treat the axial resolution component of velocity with the same bandwidth (pixel count per line) as the axial resolution component of echo amplitude. An alternative processor design might be to split the bandlimiting section 1009 (of FIG. 26) into two sections; a wider band section for a conventional receiver of high axial resolution and a narrower band section for the lower axial resolution Doppler processing. This alternative design has the advantage of preserving velocity detection over a larger dynamic range (with less spatial resolution), but has the disadvantages of bulk and cost.

Other embodiments and modifications of the present invention by one skilled in the art are within the scope of the present invention, which is not to be limited, except by the claims which follow.

What is claimed is:

1. An ultrasound system for providing time-controlled gain compensation, comprising:
   an ultrasound transducer having a specified operating range about a first frequency;

transmitter means for providing to said ultrasound transducer a transmitted signal at a second frequency; and receiver means connected to said ultrasound transducer for providing a detected signal according to reflections of said transmitted signal, wherein transmitted signal frequency is above said first frequency, wherein said time-controlled gain compensation being provided by a relative offset of the first frequency of said ultrasound transducer with respect to said transmitted signal frequency by providing a transducer which enhances received signals at frequencies different from those of the transmitted frequencies.

2. The ultrasound system of claim 1, wherein said receiver comprises means for receiving signals from said transducer of at least one of a selected signal center frequency and a selected signal bandwidth.

3. The ultrasound system of claim 2, wherein said receiver selects a plurality of received signals of decreasing center frequencies for each transmitted signal.

* * * * *